(12) United States Patent
Zhang et al.

(10) Patent No.: US 7,241,538 B2
(45) Date of Patent: Jul. 10, 2007

(54) METHOD FOR PROVIDING REPRESENTATIVE FEATURES FOR USE IN INSPECTION OF PHOTOLITHOGRAPHY MASK AND FOR USE IN INSPECTION PHOTO-LITHOGRAPHICALLY DEVELOPED AND/OR PATTERNED WAFER LAYERS, AND PRODUCTS OF SAME

(75) Inventors: Feng-Hong Zhang, Cupertino, CA (US); Limin (Eric) Lou, San Jose, CA (US)

(73) Assignee: ProMOS Technologies, Hsin-Chu (TW)

( * ) Notice: Subject to any disclaimer, the term of this patent is extended or adjusted under 35 U.S.C. 154(b) by 17 days.

(21) Appl. No.: 10/702,527

(22) Filed: Nov. 5, 2003

(65) Prior Publication Data

US 2005/0095509 A1 May 5, 2005

(51) Int. Cl.
*G03F 1/00* (2006.01)
*G03C 5/00* (2006.01)
(52) U.S. Cl. .......................... 430/5; 430/22
(58) Field of Classification Search .............. 430/5, 430/394, 22; 382/144; 716/19–21
See application file for complete search history.

(56) References Cited

U.S. PATENT DOCUMENTS

| 5,721,074 | A | * | 2/1998 | Bae ............................. 430/5 |
| 5,965,306 | A | * | 10/1999 | Mansfield et al. ............ 430/22 |
| 6,068,954 | A | * | 5/2000 | David .......................... 430/22 |
| 6,463,577 | B1 | * | 10/2002 | Omata et al. ................. 716/21 |
| 6,602,642 | B2 | * | 8/2003 | Liu et al. ...................... 430/5 |
| 6,610,448 | B2 | * | 8/2003 | Sato et al. ..................... 430/5 |
| 6,821,683 | B2 | * | 11/2004 | Toyama et al. ................ 430/5 |
| 6,824,931 | B2 | * | 11/2004 | Liu et al. ...................... 430/5 |
| 2005/0164096 | A1 | * | 7/2005 | Hong et al. .................... 430/5 |

* cited by examiner

*Primary Examiner*—S. Rosasco
(74) *Attorney, Agent, or Firm*—MacPherson Kwok Chen & Heid LLP; Gideon Gimlan

(57) ABSTRACT

Critically representative features (CRF's) for use in mask-making verification and/or resist development verification are defined and/or copied into the in-scribe area used by wafer CD features. The placement of mask-CRF's in the wafer CD bar region eliminates the problem of correctly and quickly locating mask-CRF's at different positions in the in-die areas of a manufactured mask. On-wafer counterparts of the mask-CRF's may be used for fine-tuning lithography and patterning processes.

12 Claims, 7 Drawing Sheets

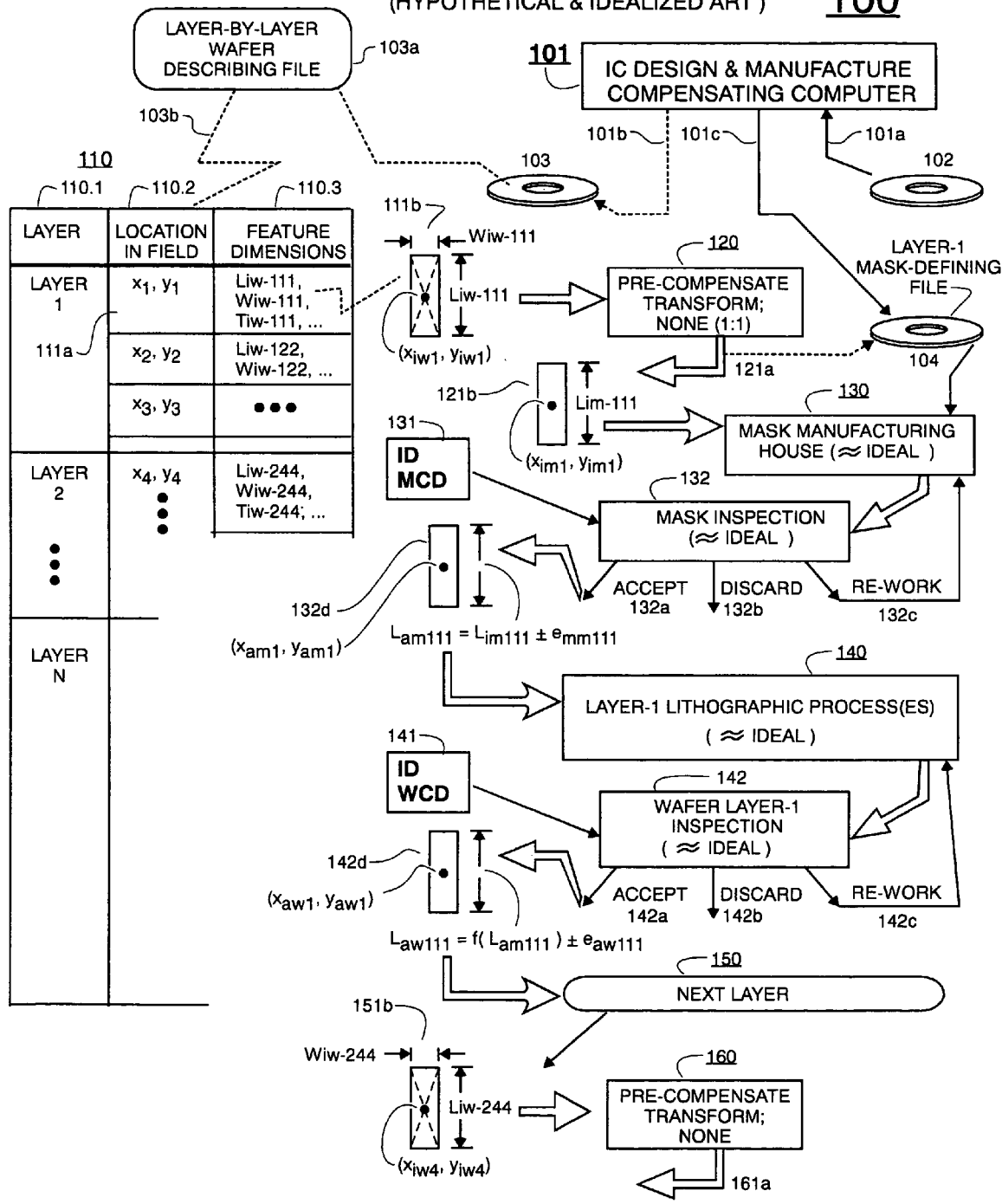

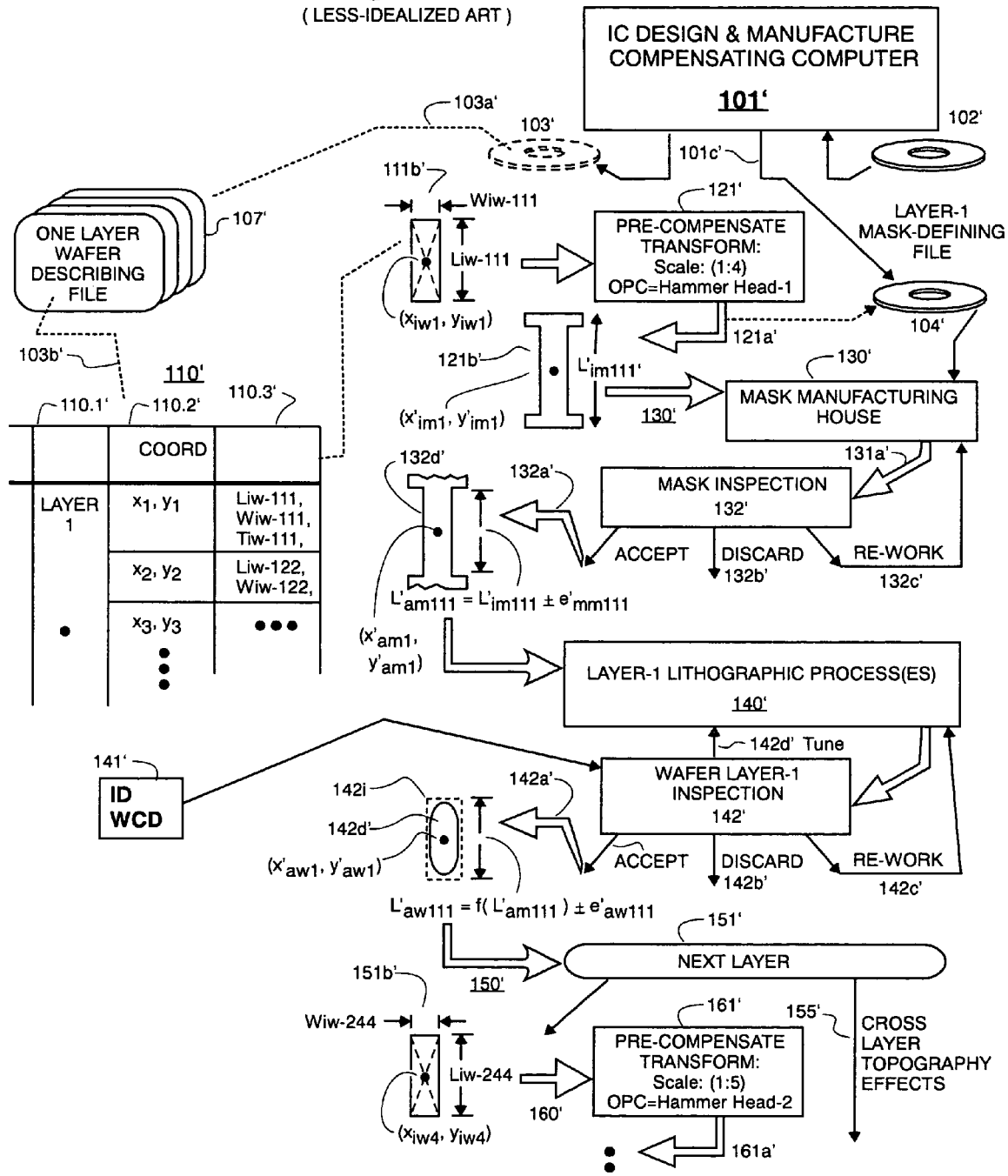

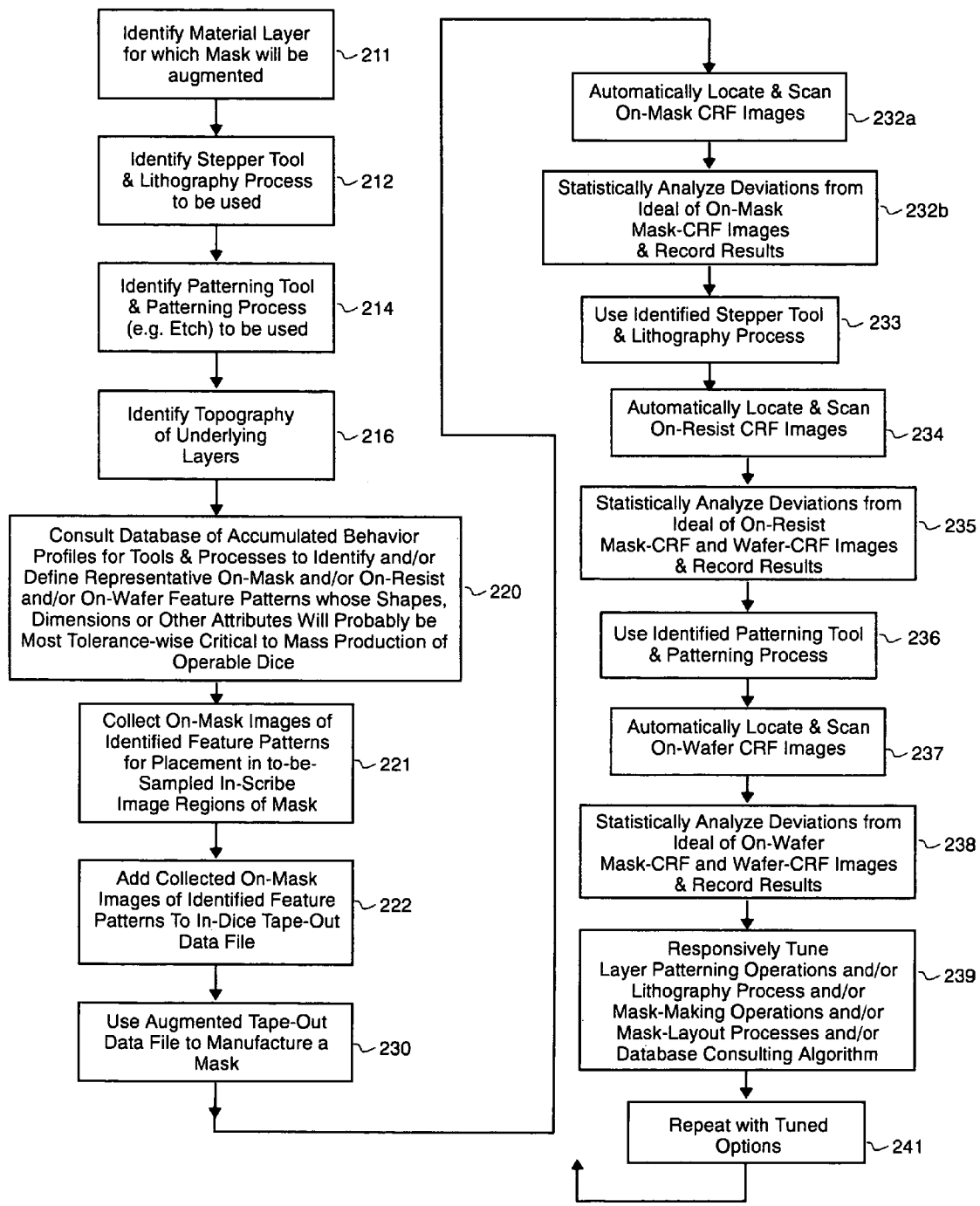

METHOD FOR PROVIDING REPRESENTATIVE FEATURES FOR USE IN INSPECTION OF PHOTOLITHOGRAPHY MASK AND FOR USE IN INSPECTION PHOTO-LITHOGRAPHICALLY DEVELOPED AND/OR PATTERNED WAFER LAYERS, AND PRODUCTS OF SAME

FIELD OF DISCLOSURE

The present disclosure of invention relates generally to the art of making photolithography masks for use in the fabrication of multilayered and monolithically-integrated devices such as integrated circuit semiconductor devices.

The disclosure relates more specifically to the steps of inspecting photolithography masks to assure they are in compliance with custom specifications, and to the steps of inspecting photo-lithographically defined and corresponding device layers for the purpose of determining if they are in compliance with custom specifications, and if not, whether the problem lies with a mask or with parameters of the photolithographic and/or patterning processes.

DESCRIPTION OF RELATED ART

A modern, monolithically-integrated circuit device (IC) is a technical wonder that often represents the accumulated expertise of large numbers of technical professionals in a wide variety of technical arts. The various arts could, by way of example, span across diverse specialties such as; at one end of an expansive and hierarchical spectrum: growing a defect-free single crystal semiconductor substrate to; at another side of the spectrum: designing system-level communications protocols and/or software which allow on-device circuits to appropriately communicate with circuits or systems that are external of the IC device. Typically, the people who are responsible for producing the single crystal substrate have essentially no interaction with the people who design the systems level communications and vice versa. They operate at far apart ends of the large hierarchy, as if they were in isolated worlds.

There are number of levels within the hierarchy that are closer to one another. For example, the steps of carrying out per-die circuit design, mask set design, per-layer mask inspection, per-layer photolithography, etching, and post-etch pattern inspection tend to follow one another in close sequence. Despite this closeness, the people who work in these subspecialties tend to treat those of the other group as if they reside in far away and isolated branches of the hierarchical tree. The circuit design groups who each specialize in the design of a unique part of an overall electronic circuit rarely worry about what other circuit design groups are doing. That task is instead left to circuit integration personnel who reside further downstream in the hierarchy and who specialize in the art of integrating (compiling) into an operable whole, the specialized circuit parts of the various circuit design groups.

At yet a next level of the hierarchy, there are wafer-layout groups who specialize in laying out the physical structure of the monolithically integrated device which will implement the compiled circuitry. The wafer-layout groups are responsible for assuring that the monolithically integrated, physical device can be mass-produced on a layer by layer basis. Then they pass the responsibility of individual layers to yet a next, downstream level of the hierarchy, where the process specialists reside. Process specialists tend to specialize in the manufacturing of specific IC layers such as specific semiconductive layers (e.g. monocrystalline, poly-1, poly-2, etc.), or specific dielectric layers (e.g., gate oxide, tunnel oxide, intermetal-dielectric, etc.) and specific interconnect layers (e.g., metal-1, metal-2, etc.). Within each of the layer-at-a-time specialties, there are reliability and mass-reproducibility specialists who work on the problem of assuring that each successive layer of the manufactured monolith will form correctly so that the final and highly complex end product operates reliably as a whole under different operating conditions and that promised operating characteristics remain within tolerance from one mass-produced device to the next.

Within the realm of the layer-by-layer specialists, there are still deeper subdivisions. One group of technologists focuses on the shapes, physical dimensions, and chemical compositions of the structures that form in the one specific device layer they are responsible for. For example, a metal group may focus on the issue of whether all interconnect lines within their given metal layer (e.g., metal-2) have uniform thickness (void free) and uniform width so that the electrical resistance of each line is within specified tolerances. They may worry about whether the isolation spacings between adjacent lines are sufficiently wide and uniform so as to avoid the danger of unintended shorts or signal cross talk. Another group of technologists may focus on the problem of how to mass-produce the one particular layer. In the case of the metal-2 example, they may worry about which kind of plasma etch tool to use and what the variable settings on that tool should be (e.g., plasma power level, gas flow rates, etc.).

Typically, yet another distinct group of specialists will focus on the problem of how to make the photolithography mask or masks that will support the layer-making job of the former group. For example, if stepper B is to be used instead of stepper A, how will that affect the design and manufacture of the corresponding photolithography mask? If the mask is to have real-time modifiable sections (e.g., LCD sections) how will that affect the design, manufacture and testing of the corresponding photolithography mask? If plasma-etch tool D is to be used instead of tool C, how will that further affect the design and manufacture of the corresponding photolithography mask? Yet another problem which the mask specialists may focus on, is how to determine if the mask for stepper/tool pair B/D has been properly manufactured. Yet a further problem which the mask specialists may focus on, is how to find a mask manufacturer who can quickly and correctly make and deliver a desired mask. These latter problems are not the immediate concerns of the more downstream groups who will carry out the photolithography exposure process, the resist-development process and the post-lithography etch or other patterning operation. The problems should be their concern though. If a mask is delivered late, the downstream specialty groups will be delayed in being able to test and fine tune their portions of the overall project. If a mask is delivered with hard-to-discover defects in (e.g., two critical island features among thousands that are too close to each other), then the undetected defects may have serious repercussions further downstream when the final IC fails to operate in accordance with specifications. Therefore it would be wise for the post-lithography groups to worry about the mask-making process.

Nonetheless, it has become customary in the industry to shift the responsibility for each task along the traditional top-down, hierarchical pyramid on a limited need-to know basis. In other words, the metal-2 structure engineers may tell the process engineers, "We don't care how you get the job done, just make sure our layer has this custom structure, this composition, and its dimensions comply with these given tolerances." In turn, the process engineers may tell the mask-making specialists, who occupy a different rung on the hierarchy tree: "We don't care how you get the job done, just make sure that our mask has this custom structure in its in-die areas and that its dimensions comply with these given tolerances. It is none of your business what we will do with the mask once you satisfy these custom specifications. Here is the tape-out file for the mask." The mask making specialists will try to do just what they are told and then pass responsibility back to the process engineers.

This back and forth passing of responsibilities can lead to embarrassing confrontations between specialty groups. When the mask layout group orders a new mask, the layout group typically provides a computer-generated, mask layout file to the mask-manufacturer. In addition, the layout group typically and separately provides the mask-making specialists with a list of special coordinates within the operable device areas (in-die areas) of the mask layout. The given coordinates specify certain in-circuit features of the mask that are to be considered as being critical and representative of the rest of the in-circuit features. In essence the mask layout group is telling the mask-making specialists the following: "If you manufacture for us a mask where these specific feature islands (which islands are located at these in-die coordinates within the mask) have the following custom shapes, dimensions, and tolerances, then you will be deemed to have successfully completed your part of the job. If the features at the listed locations do not comply with the following custom requirements, you will have to try again."

At this stage of the game, the possibility emerges for the proliferation of a host of downstream problems. Mask-making is often an expensive and time pressured endeavor. The customized nature of mask-making and the fact that the requested feature sizes are often at the leading edge of shrinking geometry capabilities often contribute to the cost and pressure. The fact that the customer often wants the mask delivered as soon as possible (ASAP) is another factor. Neither the mask-maker (mask vendor/manufacturer) nor the mask user (mask customer) wants to face a situation where mask-making goals are not met because the critical and representative in-circuit features of the mask are not in compliance with the given specifications. If the mask maker is forced to re-manufacture a given mask, both the vendor and the customer will be unhappy. In particular, the mask customer will typically be the more displeased party because the customer is usually in a hurry to have possession of a complying mask as soon as possible (ASAP). The not-yet-produced mask will often be delaying the turn-on of a mass production line. The not-yet-produced mask will be blocking process engineers from testing and fine tuning their respective IC fabrication processes.

One of the more embarrassing interactions that can happen between a mask-maker and a mask-purchaser is that of the mask maker (vendor) contacting the mask specifier (customer)—often via a long distance telephone call—to explain that the maker has tried more than once to do so, but could not get a critically representative feature to match the given specifications. After some back and forth investigation it is discovered that the wrong coordinates have been used to define what constitutes the critically representative, on-mask feature. For some reason, the supplied list of representative feature coordinates does not match the mask tape out. Now the mask vendor is upset for having wasted time and effort in chasing after an unachievable goal and the mask customer is even more upset that so much precious time has elapsed without success.

The how and why behind such an embarrassing interaction between the mask purchaser and mask vendor is somewhat complex. It will be explained in more detail below. There are ways, however, of avoiding the problem and of further providing for improved control over mask making and improved control over process tuning as shall also be detailed below.

INTRODUCTORY SUMMARY

Structures and methods may be provided in accordance with the present disclosure of invention for improving over the above-described shortcomings in the industry.

More specifically, in accordance with one set of aspects of the present disclosure, critically representative features (mask-CRF's) of the in-die parts of the mask are copied to, and/or defined within, one or more portions of the photolithography mask, where the destination mask portions correspond to in-scribe areas of the corresponding wafer. The in-scribe portions of the mask at which the critically representative features (mask-CRF's) are placed further correspond to topographically consistent sample points in the respective material layer of the corresponding wafer, where the respective layer is one that is to be disposed on other pre-patterned layers and that is to be lithographically derived from the mask. In this way, when the photoresist for the respective material layer is developed, the corresponding in-resist and in-scribe, counterparts for the mask's critically representative features (resist counterparts of the in-scribe mask-CRF's) will be placed in topographically indistinct sample areas of the resist, thereby allowing for better sampling and analysis of resist development. Furthermore, the corresponding in-wafer and in-scribe, counterparts (wafer counterparts of the in-scribe mask-CRF's) will be placed in topographically indistinct sample areas of the patterned wafer layer, thereby allowing for better sampling and statistical analysis of the material layer's patterning process.

In one set of embodiments, the mask-CRF's (those representative parts or proxies of the mask which are deemed to have critical dimensions and/or critical shapes for purposes of mask making) are placed near and/or intermingled with on-mask counterparts of wafer-CRF's (those representative parts of the wafer which are deemed to have critical dimensions and/or critical shapes for purposes of wafer making). More specifically, the mask-CRF's are placed near to and/or overlappingly within the in-scribe CD-bar features of the corresponding wafer layer and aligned to the CD-bar alignment mark so that the CD-bar alignment mark may be used for also automatically locating and/or aligning the mask-CRF's when the mask is inspected. As a result, there is no longer a need for providing precise coordinates for in-die features that are to serve as critically representative features for mask-making. Additionally, the in-scribe mask-CRF's can provide useful information to downstream fabrication groups when the corresponding wafer is lithographically patterned.

A mask inspecting method in accordance with the disclosure comprises one or more of the steps of: (a) automatically finding on a given mask, the locations of mask-CRF's (critically representative features of a photolithography mask) by machine scanning for on mask counterparts of CD-bar alignment marks and automatically aligning to the mask-CRF's by using the mask counterparts of CD-bar alignment marks; (b) comparing the automatically located mask-CRF's to supplied mask-CRF specifications and determining for three or more different, in-scribe locations where similar mask-CRF's should be found, the differences between the supplied mask-CRF specifications and the correspondingly observed, mask-CRF's in the in-scribe locations; (c) performing statistical analysis on the differences determined for the three or more different, in-scribe locations; and (d) based on the performed statistical analysis, indicating whether the mask is compliance or not with predefined tolerance parameters.

A mask producing method in accordance with the disclosure comprises one or more of the steps of: (a) receiving computer-readable specifications for on-mask counterparts of in-die patterning features; (b) receiving computer-readable specifications for on-mask counterparts of in-scribe positioned, wafer-CRF's; (c) receiving computer-readable specifications for on-mask critically representative features (mask CRF's); (d) in response to the received specifications, generating a mask-defining, computer-readable specification which positions and/or aligns the mask-CRF's in in-scribe locations of the mask and adjacent to and/or intermingled with on-mask counterparts of wafer-CRF's (critically representative features used during inspection of developed resist and/or a corresponding patterned wafer layer); and (e) producing a physical mask having its mask-CRF's positioned in in-scribe portions of the mask and adjacent to and/or intermingled with on-mask counterparts of wafer-CRF's, where the mask-CRF's are further aligned to on-mask counterparts of mask-CRF alignment marks.

A lithography tuning method in accordance with the disclosure comprises one or more of the steps of: (a) providing a photolithography mask having both mask-CRF's (critically representative features for use in mask inspection) and on-mask counterparts for wafer-CRF's (critically representative features for use in wafer inspection) disposed in in-scribe portions of the mask; (b) using the provided mask in exposure of a first radiation-sensitive resist layer of a corresponding, first in-process wafer for thereby defining a developed lithography pattern in the first radiation-sensitive resist layer; (c) after development, inspecting lithographically patterned parts of the resist corresponding to the in-scribe mask-CRF's to determine how closely the inspected resist parts conform to predefined, ideal lithography developments desired from use of the corresponding mask-CRF's; (d) adjusting one or both of the exposure and development process used in step (b) and then repeating steps (b) and (c) instead for a second radiation-sensitive resist layer of a corresponding, second in-process wafer; (e) determining whether the adjustments of step (d) caused the inspected resist parts of the second developed resist layer to more closely conform to said predefined, ideal lithography results; (f) physically patterning (e.g., etching) the first and second in-process wafers; (g) after physical patterning, inspecting physically patterned parts of the first and second wafers corresponding to the in-scribe mask-CRF's to determine how closely the inspected patterned parts conform to predefined, ideal patterning results desired from use of the corresponding mask-CRF's; (h) adjusting one or more of the exposure, resist development and physical patterning processes used in steps (b) and (f) and then repeating steps (b) through (g) instead for corresponding third and fourth, in-process wafers having respective third and fourth radiation-sensitive resist layers; and (i) determining whether the adjustments of step (h) caused the inspected resist parts and/or inspected patterning results of the third and fourth, in-process wafers to more closely conform to said predefined, ideal lithography developments and/or ideal patterning results than did those of the first and second in-process wafers.

A manufactured integrated circuit wafer in accordance with the disclosure comprises a plurality of dice separated by in-scribe areas, and within the in-scribe areas: a combination of patterned features resulting from mask-CRF's (critically representative features of plural photolithography masks used to make the wafer) and patterned features resulting from on-mask wafer-CRF's (the latter patterned features being critically representative features of layers of the wafer itself).

Other aspects of the disclosure will become apparent from the below detailed description.

BRIEF DESCRIPTION OF THE DRAWINGS

The below detailed description section makes reference to the accompanying drawings, in which:

FIG. 1D is a more detailed flow chart for showing how, in an idealized and hypothetical fabrication line (one having no need for optical proximity compensations), in-process work may flow from one technology group to the next;

FIG. 1E is a flow chart for showing how, in a less idealized and hypothetical fabrication line (one which does make use of optical proximity compensations (OPC's)), in-process work may flow from one technology group to the next;

FIG. 2B is a second flow chart showing how in-scribe mask-CRF's may be defined and used in downstream inspection operations.

DETAILED DESCRIPTION

Figure 1A:
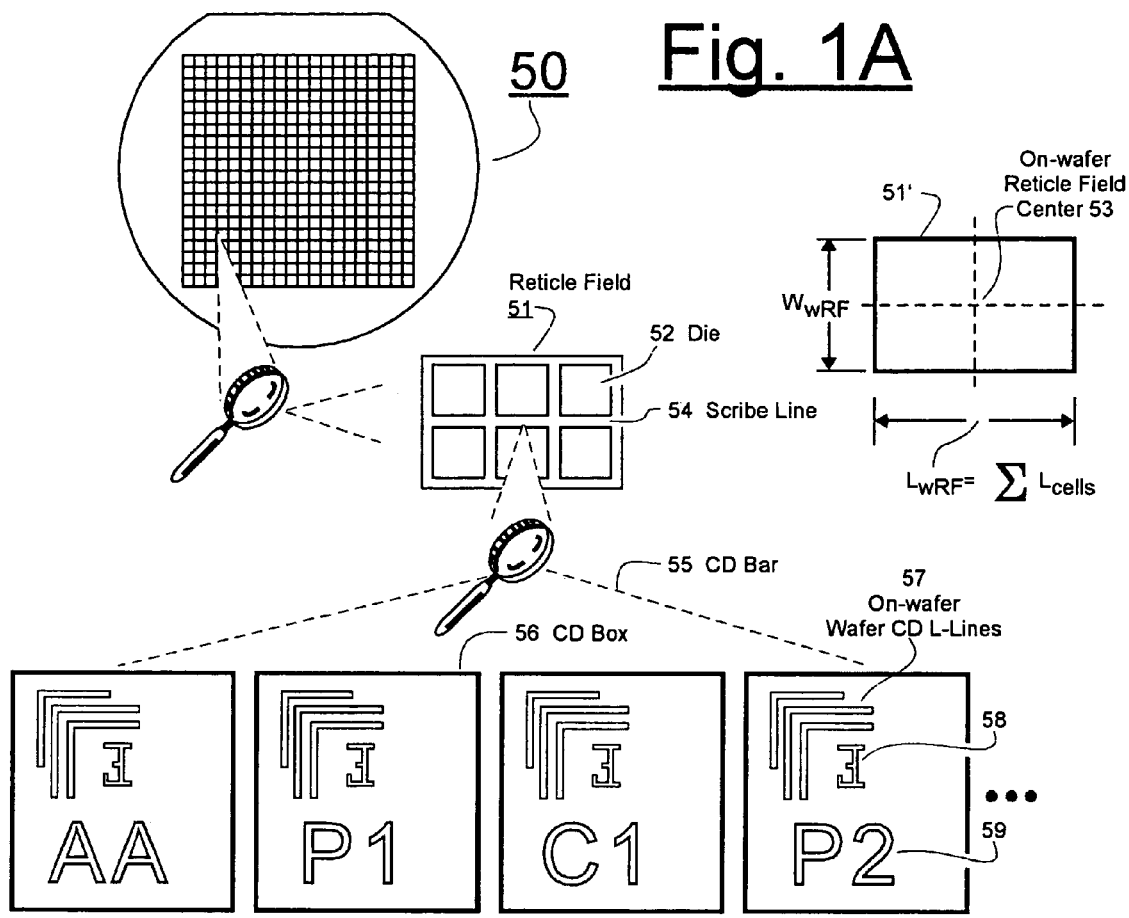
FIG. 1A is a schematic top plan view for introducing the concepts of on-wafer reticle fields and in-scribe CD-bar lines.

FIG. 1A schematically shows a series of top plan views of a finished integrated circuit wafer 50 and of certain features that may seen on the wafer and/or found within the multiple layers of the finished wafer 50. More specifically, the finished wafer may be seen to have repeated features that are tiled one adjacent to the next so as to give the wafer an appearance of having streets running north-to-south and east-to-west with congested building sections placed between the relatively empty streets. Each of the building sections is conventionally referred to as a die. Each of the linear and relatively empty streets is conventionally referred to as a "scribe line". When the manufacture of the wafer is essentially complete, it is scribed along its scribe lines and broken up into individual dice. The individual dice may be later hermetically sealed into ceramic or plastic packages and sold as individual IC devices. Since the areas of the scribe lines are typically destroyed, such areas are usually devoid of functional (operable) circuitry.

The first blush recognition of individual dice and scribe lines can be somewhat misleading. Actually, the wafer 50 is more accurately pictured as being divided into sections known as reticle fields, where each reticle field has two or more dice. An example of a reticle field is shown at 51. The illustrated field 51 contains six (6) dice, with the square denoted as 52 representing one of those dice. The six exemplary dice are arranged as a 3-by-2 rectangular array. Otherwise configured arrays can, of course, be formed. The array in field 51 has at least one horizontal scribe line 54 extending through roughly the middle of the reticle field and a number of vertical scribe lines extending through the reticle field in locations that are also spaced away from the edges of the reticle field 51.

Figure 1B:
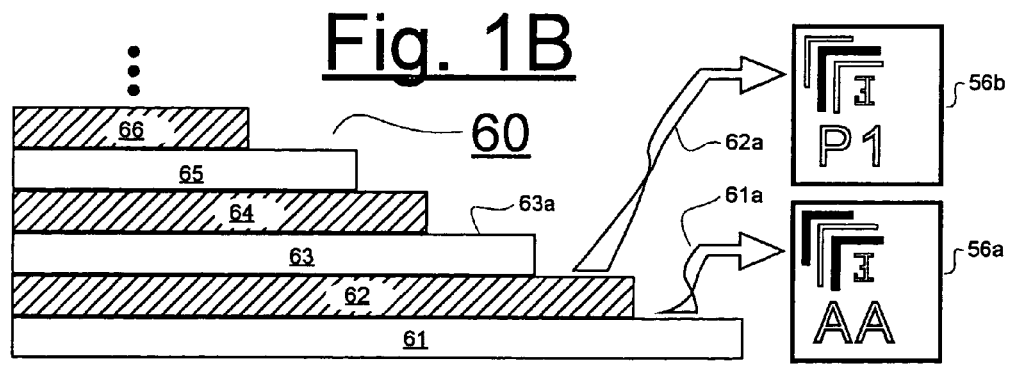
FIG. 1B is a side cross sectional view showing the placement of CD-bar boxes in different layers of the wafer of FIG. 1.

The reticle field 51 may be crudely thought of as an imprint that is left behind by an inked stamp which was sequentially stepped across the wafer so as to stamp out the series of dice and scribe lines shown at 50. That however is still not an accurate picture because the wafer 50 is comprised of a series of different layers stacked one on top of the other. This is shown in the cross-section of FIG. 1B. The on-wafer reticle field 51 may be better pictured as a stacked series of stamps whose respective patterns have been stepped across the respective stacked layers (e.g., 61–66 of FIG. 1B) of the wafer as the wafer was manufactured. A different "stamp" may be used for each of the different layers of the wafer. For example, in FIG. 1B, the bottommost layer 61 may represent a monocrystalline silicon layer which is sometimes known as the AA layer or the "active area" layer. Another layer 62, positioned further above layer 61, may represent a first polysilicon layer or P1 layer. (Typically, a gate oxide layer is interposed between the active layer 61 and the P1 layer 62.) A further layer 63, positioned yet higher on the stack, may represent a first inter-poly dielectric layer (the C1 contact layer). The C1 layer may be used for separating floating and control gates in a stacked flash memory device. Layer 64 may represent a second polysilicon layer (P2) and the yet higher layer 65 may define a second dielectric material (the C2 contact layer) through which a contact mapping is defined to a next, higher conductive layer (e.g., M1). The uppermost of the illustrated layers, 66 may define a first metal layer (M1). There can be many more layers above or between the illustrated ones. It is to be understood that FIG. 1B is merely illustrative and that the layers of a wafer do not have to stepped back from one another as is shown in the figure to expose the CD boxes (e.g., 56a, 56b). Transparent films may be added to protect the CD box areas (e.g., 56a, 56b) while allowing their indicia (e.g., AA, P1) show through to the top of the wafer. The step-like structure shown at 60 is merely for better showing how CD-bar boxes (described below) can be topographically isolated from one another and from other features of underlying layers.

Referring again to FIG. 1A, each die 52 within the wafer reticle field 51 may be more precisely thought of as being composed of a large plurality of circuit cells that are tiled adjacent to one another like puzzle pieces. The adjoined puzzle pieces form the compiled structure of the die 52. Each circuit cell (not shown) has a corresponding length dimension and a width dimension. These length and width dimensions can change as the circuit cell is designed and redesigned. Often, the geometric center of each cell is used as a reference point for specifying where different features of the cell are located. Relative coordinates are given for different features. The absolute coordinates of the cell's reference point (e.g., its center) usually have to be added to relative feature coordinates in order to obtain the absolute coordinates of those in-cell features. When the design of a wafer reticle field (see now representation 51' instead of 51) is finished, its total length, $L_{wRF}$ is equal to the sum of the individual lengths of the different circuit cells that fill a horizontal row across the reticle field 51'. Similarly, the total width, $W_{wRF}$ is equal to the sum of the individual widths of the circuit cells that fill a given column within the reticle field.

When practitioners wish to identify a specific location within the compiled reticle field 51' (either when the field is located on-wafer or on-mask), they typically specify the very center 53 of the on-wafer/on-mask reticle field as the origin (x=0, y=0) and they then provide x, y coordinates relative to this specified origin. It should be appreciated that this procedure has some inherent dangers. First, some amount of uncertainty, or error, can enter the picture as one tries to find the "exact" center 53 of the reticle field. The error may be attributed in part to possible errors or uncertainties encountered in locating the "exact" edges of the reticle field. Further error may be attributed to the step of measuring the exactly half-way position between the found horizontal and vertical edges of the reticle field. Also, it is possible that mistakes may be made in trying to find a given displacement from the true center 53 of a given reticle field 51' to the true center of a given die and then within the given die, to accurately find a further displacement from the true center of the die to a true center of a given cell. In cases where relative in-cell or in-die coordinates are used, a utilized set of x and y coordinates may point to a location that is shifted away from the on-wafer or on-mask location intended by the specifier of those coordinates. If the given x, y coordinates are intended to point to a specific in-die and/or in-cell feature, it is possible that the person (or computer) using those given coordinates will instead reference a different, on-mask or on-wafer feature. One of the reasons why this could happen is because one or both of $L_{wRF}$ and $W_{wRF}$ may have changed between the time the coordinates were recorded and the time the wafer's mask and/or the wafer itself are made and inspected.

FIG. 1A shows yet another feature of a conventional wafer. It shows that the central scribe lines (54, and/or other scribe lines) of each reticle field 51 may include a structure known as the "CD bar" 55. The CD bar structure 55 may be comprised of a plurality of respective CD boxes like 56 in the respective layers 61–66, etc. Each CD box 56 typically includes an on-wafer plurality of CD L-shaped lines such as shown at 57. These on-wafer CD lines 57 may be used for confirming that certain critical dimensions of a given layer of the wafer are properly formed after the wafer layer is patterned. (We repeatedly preface the discussed features with the word "wafer" here because soon we will be distinguishing between on-wafer features and on-mask features.) The typical CD box 56 will also include an automatic alignment mark such as shown at 58. The automatic alignment mark 58 allows automatic alignment equipment to find the on-wafer mark 58 automatically and quickly. The alignment mark may have a design which is very different from the backwards-facing E shown at 58. The design of the alignment mark may vary according to specific needs or features of different, automatic alignment tools.

The typical CD box 56 will also include microscopically sized, and human-readable indicia such as shown at 59. Such human-readable indicia 59 may be used by a technician looking through an optical microscope to determine which layer now forms the top most layer of the in-process wafer and which layers have been formed before-hand and in what sequence. When a new layer is defined on the in-process wafer, the CD box 56 of the previous layer is often positioned immediately adjacent to, and visibly alongside the CD box of the new layer. A visible sequence of CD boxes is therefore created as the in-process wafer moves from one processing stage to the next. So simply by finding the visible human-readable indicia 59 of the last CD box in a sequence 55 of such boxes, the technician can determine which layer is topmost. (Even if one or more lower layers are covered by opaque material, the technician should still know the sequence of layers and he/she should know which one will routinely be topmost. For example, it is apparent that P2 is above P1.) More specifically, if the active layer 61 (FIG. 1B) of an in-process wafer 60 is the topmost layer, then the AA layer box 56a will be visible at surface location 61a of the layer. Later, when layer 62 is defined over layer 61, the first CD box 56a will still remain visible alongside in the CD bar area 55 and the new CD box 56b (P1) will show up at surface area 62a of the new, top most layer 62 of the in-process wafer. A yet further CD box will form in region 63a of the next layer 63 (and laterally alongside previous CD boxes 56a, 56b) when that next layer 63 is defined, and so on.

Figure 1C:
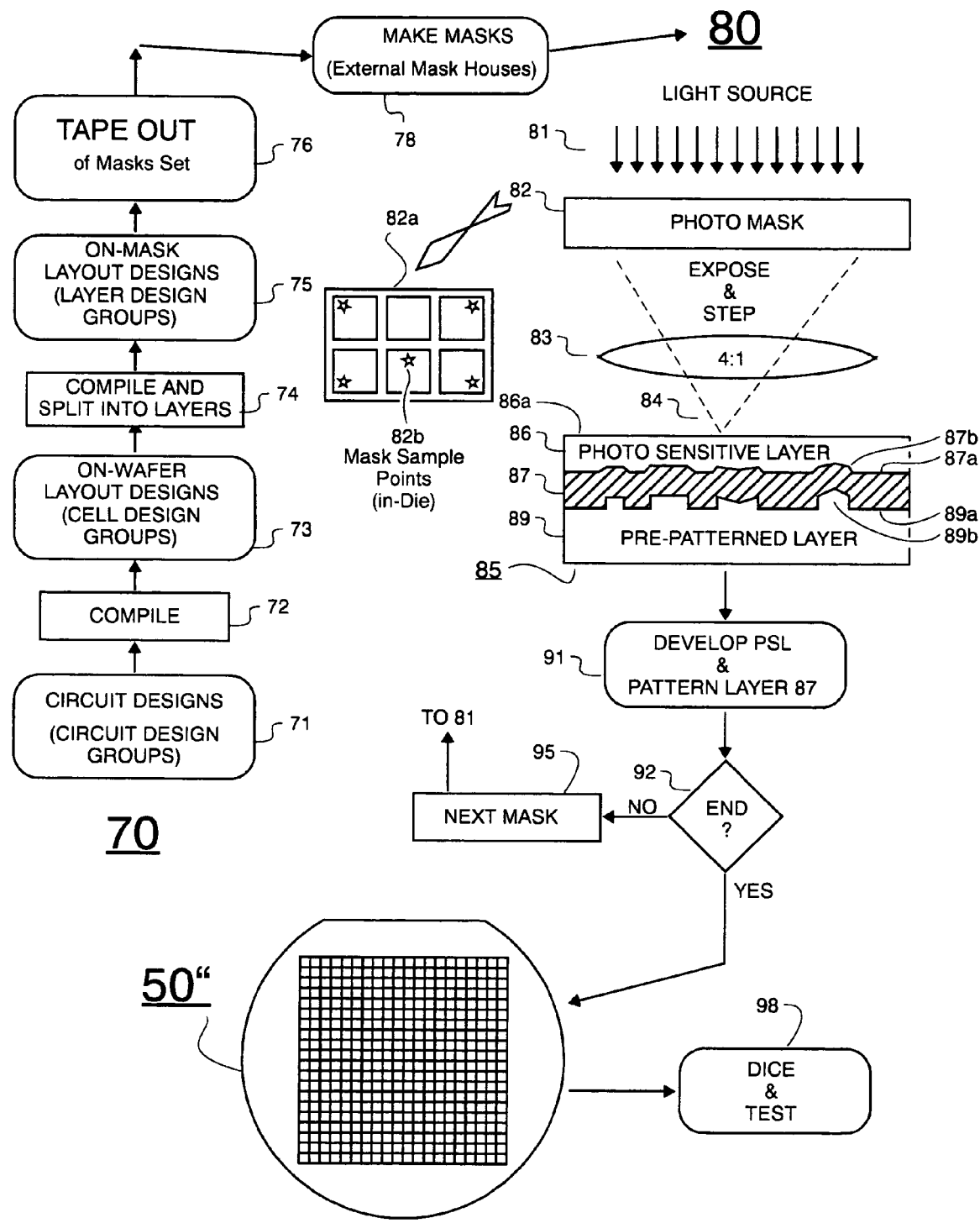
FIG. 1C is a flow chart for showing the passing of responsibilities between various technology groups as respective layers of an in-process wafer are specified, as a corresponding mask is made, as the mask is used to lithographically expose a photosensitive layer, and as the latter layer is developed and patterned.

It was explained in the background section that responsibility for the design and fabrication of each respective layer (e.g. 61–66) of an in-process wafer is often shuffled from one technology specialty group to next with little in the way of overlapping cooperation. The containerization of information on a need-to-know basis works well in many situations. However, it can also be the reason for the above-described, unpleasant confrontation between the mask-maker and the mask-purchaser. FIG. 1C is a flowchart that schematically shows more clearly how such containerized passing of responsibility can occur between the different technology groups. FIG. 1C shows how the respective layers of an in-process wafer progressively become more clearly specified as responsibility passes from function-defining groups to structure-defining groups.

The overall process shown in FIG. 1C is divided into a design section 70 (left side) and a fabrication section 80 (right side). In the design phase 70, a large plurality of circuit designs 71 are formed by respective circuit-design specialty groups. In step 72 the circuit designs of the different groups are compiled to form a more cohesive whole. There is a hierarchy of design cells. Big cells are made of interconnected smaller cells. With each compilation of child cells to form an encompassing, parent cell, a remapping of relative, physical coordinates may occur. At some point, high up on the design-phase's hierarchy tree, the on-wafer 3-D layout designs are formed for the upper-level super cells by respective super-cell design groups. The on-wafer layout designs 73 are then compiled in step 74 to define the full 3-D (three dimensional) structure of the wafer that is to be fabricated. Then that 3-D description is split into respective 2-D layers. The stacked 2-D layers of the original 3-D description are in essence, unstacked and operatively separated from one another. More specifically, one of the on-wafer 2D layout designs may be for the active area layer (AA), a second of the on-wafer 2D layout designs may be for a first contact layer (C1), and so on. These 2D layout designs are typically handled separately after they are logically unstacked from one another.

Each physical 2D layer of the to-be-fabricated wafer can have its own unique composition and its own unique set of requirements for lithography and patterning. Accordingly, a different kind of photolithographic mask (or plurality of such masks) may be called for in the fabrication of each unique 2D layer (e.g., AA, P1, C1, P2, C2, etc.). In step 75 the respective on-mask layout designs for each respective photolithographic mask are prepared by the corresponding layer design groups. When the layout designs (75) for all the masks are finished, the composed mask set is ready for a step known as "tape out" 76. The fully-designed wafer is now ready to enter the physical fabrication phase 80. Typically, each of the 2D mask layout designs is digitally encoded as a respective computer data file and that respective computer data file is sent to a respective one of, or possibly more of, different mask-making houses for manufacturing of the mask. The decision as to which mask-making house will make each mask may depend on the complexity of the respective mask and/or on the price and/or turn-around speed of the corresponding mask-making house. For some of the wafer layer masks, turn-around speed may be more important than price. For others, the situation may be reversed. Box 78 represents the steps of sending the tape out files to the respective mask-making houses and also the steps of receiving the correspondingly manufactured masks back from those houses.

Fabrication phase 80 includes a lithographic exposure state. In this state, a given wafer 85 (an in-process wafer) has been coated with a photosensitive layer (PSL) 86 and the upper surface 86a of the PSL has been planarized. Radiation 81 from a given light source or other kind of radiative source is passed through one of the manufactured photomasks 82 for projection onto PSL surface 86a. The mask image is typically transformed optically by a stepper optical system 83. By way of example, the projection transformation can include a 2D dimensional reduction of about 2 to 1 and more typically it will include a reduction amount of about 4:1 or about 5:1. The so-transformed mask image is projected into a first reticle area 84 within the larger surface area 86a of the photosensitive layer. Sufficient exposure time is provided for photochemically altering the exposed first reticle area 84. Then the stepper steps the projected mask image to a next reticle area adjacent to first area 84. The expose and step procedure is repeated until all desired reticle areas on surface 86a have been exposed. This is how the photomask 82, in essence, becomes a stamp which repeatedly imprints the reticle pattern across the wafer 85, one step after the next. Needless to say, if there is an error or defect in the photomask 82, that problem might be replicated many times across the entire wafer. It is important to for the photomask 82 to be defect free.

There is one important detail that has not yet been mentioned. Before the photomask 82 is placed into the stepper and used for exposing (84) the photosensitive layer 86, the mask 82 is usually subjected to a mask inspection procedure. It is microscopically inspected to assure that its opaque features and/or transparent features and/or semi-transparent features (if any) and/or programmably-shutterable features (if any) have been shaped, dimensioned and/or otherwise manufactured in accordance with design specifications. The mask is often too complex to be thoroughly inspected. So a unique set of mask sample points 82b will instead be identified, studied in detailed, and taken to be fair representatives of the remainder of the mask. Typically, each of the specified mask sample points 82b will include representative, and critically dimensioned features of the mask (mask-CRF's).

A top plan schematic view of the mask 82 is shown at 82*a*. The schematic top plan view 82*a* of the mask shows that the mask sample points 82*b* are typically distributed in a star like pattern within the in-die regions of the mask so that statistical analysis may be made of deviations from the ideal across the surface area of the mask. If the statistically-studied deviations exceed one or more predefined thresholds, the mask may have to be repaired or remanufactured. There will be delay, extra costs, and an upset mask-maker and/or customer.

The story does not end or begin there. FIG. 1C shows that the exposed wafer 85 typically has a number of pre-patterned and/or other layers below the planarized, photosensitive layer 86. One of the subsurface layers may be a bulk substrate or other pre-patterned layer 89 which has various topographical features disposed on it such as the illustrated flat section 89*a* and mesa 89*b*. Between the pre-patterned layer 89 and the PSL 86, there will be at least one material layer 87. This at least one material layer 87 is to be next physically-patterned after the exposed photosensitive layer 86 is developed. The top surface 87*a* of the material layer 87 is typically planarized by CMP or other means. However, despite such planarization attempts the top surface 87*a* may still have some minor bumps and/or depressions (e.g. 87*b*) due to the topographical effects of the underlying mesas (89*b*) and/or due to idiosyncrasies of the planarization process (e.g., CMP dishing or erosion). Additionally or alternatively, optical reflections from the lower layer 89 may cause the photosensitive layer 86 to react differently due to the underlying topographical features 89*a*, 89*b*. (Often an Anti-Reflection Coating or ARC is interposed between PSL 86 and underlying layers. The ARC may not be 100% effective.) One thing to be noted is that there may be some areas of both the prepatterned lower layer 89 and the to-be-patterned material layer 87 which are simultaneously relatively flat, relatively large, and intentionally placed there so as to lay one on top of the other. In FIG. 1C the overlying areas of interest are 89*a* and 87*a*. In particular, it will become apparent that the stacked combination of relatively large and flat regions 87*a* and 89*a* tend to appear in the in-scribe sections of the wafer 85. The significance of this stacked combination of relatively flat areas (87*a*/89*a*) will become clearer below.

In step 91 of fabrication phase 80, the step-wise exposed photosensitive layer (PSL) 86 is developed and used to physically pattern the underlying layer material 87. The physical patterning may include plasma etching and/or other forms of physical patterning. In a subsequent step 92 it is determined whether step 91 was the last photolithographic patterning round for the in-process wafer. If the answer is NO, then a next mask is obtained in step 95 and the process is repeated by projecting further radiation through the next mask (95) and its associated optics. The associated exposure radiation (81) and/or optics (83) and/or PSL (86) of the next mask (95) can be substantially different from those used for the earlier mask 82. Steps 91 and 92 may be repeated many times before the answer at step 92 is YES. In each repetition, the respective material layer (87) can be substantially different as can be the respective development and patterning processes (91) as well as the resulting patterns. The completed wafer 50" which emerges from the YES path of step 92 may subsequently be sent to a wafer sort, dice, and re-test facility. In wafer-sort the wafer is pretested as a whole before dicing. After scribing and dicing, the individual die are further tested. Additionally, even during each successive round of photolithographic development and patterning (91), the in-process wafer (85) will often be inspected and/or tested to assure that it is worthwhile to keep fabricating the wafer or to assure that the exposure optics (83), PSL material (86), to-be-patterned material (87), and the photolithographic development and patterning operations (91) are functioning as desired. We now dig yet deeper into such details.

FIG. 1D shows yet more about the processes of: (a) designing the layouts of the respective layers in the wafers, (b) designing the layouts of corresponding masks, (c) manufacturing the corresponding masks, (d) using the masks, and (e) inspecting the results. These aspects can become quite complicated. To keep things simple, we first assume an idealized and hypothetical world 100. In this simplified world 100, the optics (83 of FIG. 1C) are perfect, the photochemistry (86) is straightforward, the patterning (91) is defect free; and as such, there is no need for making any pre-compensating transformations (120 in FIG. 1D) to feature shapes and/or dimensions as one moves from the domain of design-specified, "on-wafer" features (111*b* in FIG. 1D) to the domain of design-specified, "on-mask features" (121*b* in FIG. 1D). Even the projection scaling factor between the mask image and the resist image is assumed to be one-to-one (denoted as 1:1 in box 120).

The idealized world 100 of FIG. 1D includes a design-assisting computer 101 which helps the IC design and fabrication teams to produce the mask "tape outs" (76 in FIG. 1C) and to track results on the idealized manufacturing floor. Appropriate computer instructing signals 101*a* (software) are manufactured and loaded into the computer 101 from corresponding computer readable media 102. The installed software causes the computer 101 to provide desired services for supporting wafer layout tasks and mask layout tasks. It is assumed that computer 101 can output data signals 101*b* representing a mega-file 103*a* to storage media 103. The hypothetical mega-file 103*a* contains a layer-by-layer detailed description of the entire, to-be-fabricated, wafer (50" of FIG. 1C). Connecting line 103*b* indicates that within the layer-by-layer wafer-describing mega-file 103*a* there will be a large table 110. The table 110 includes: (1) a layer-identifying column 110.1, (2) a feature location specifying column 110.2 and (3) a feature shape and dimensions specifying column 110.3.

More specifically, for a given first layer of the to-be-manufactured wafer (say layer 89 of FIG. 1C) there will be a set of coordinates (e.g. $x_1$, $y_1$ in row 111*a*) which specify a base location for a given feature (111*b*) within that respective LAYER-1. The feature shape and dimensions column 110.3 of the corresponding row (111*a*) will provide idealized dimensions for the corresponding feature 111*b*. For example, the shape and dimension specifications may include: (1) an idealized in-wafer feature length value ($L_{iw\text{-}111}$), (2) an ideal, in-wafer feature width value ($W_{iw\text{-}111}$), an ideal, in-wafer feature thickness value ($T_{iw\text{-}111}$) and/or other indicia for other idealized aspects of the given feature (111*b*) whose base location is given as $x_1$, $y_1$. There will be similar coordinates and other parameters for further features of LAYER-1 as is shown in Table 110 of FIG. 1D. Similarly there will be further coordinates and other parameters for further features of subsequent material LAYERs 2 through N as is indicated in Table 110.

A graphical representation of the "idealized" feature of table row 111*a* is shown at 111*b*. It is "idealized" (i) because it has not yet been fabricated. It is mostly still an idea which is specified by the data signals of mega-file 103*a*. When the counterpart of feature 111*b* will actually be fabricated later on, that fabricated, and "on-wafer", counterpart will be referred to as the "actualized" (a), on-wafer (w) feature. See item 142d of FIG. 1D. For simplicity sake, the computer-defined, "idealized" feature 111b is shown as a simple rectangle having its center located at an idealized on-wafer position given by coordinates $x_{iw1}$, $y_{iw1}$ This exemplary feature 111b further has the idealized, on-wafer length, width and thickness parameter values given in row 111a of the mega-file 103a.

Typically, a full-sized (1:1) exact replica of the idealized, in-wafer feature 111b will not be copied onto the corresponding LAYER-1 mask (e.g., 82 of FIG. 1C). Instead there will be some form of compensating transformation 120 made from the idealized in-wafer coordinate system of file 103a to the corresponding "on-mask" coordinate system used by a counterpart, taped-out mask file 104. There may also shape-shifting transformations that pre-compensate for complex optical and photochemical effects of the real-world step (84), develop (91) and pattern (91) processes of FIG. 1C. However, to keep things simple for now, it is assumed in FIG. 1D that the box 120 transform is a simple 1:1 transform. Accordingly, the corresponding and idealized in-mask feature 121b that is output by box 120 has the same length, now specified as $L_{im\text{-}111}$ and same coordinates, now specified as: $(x_{im1}, y_{im1})$ as those of the original, computer-defined feature 111b. The feature specifications on file 104 are denoted as "im" to indicate that they are "idealized" (because the actual mask has not yet been made) and they are "on-mask". Similarly, the earlier, idealized, on-wafer parameters were denoted as "iw"). The "im" feature 121b is seen to be represented by output data signals 121a emerging from transformation box 120. More realistically, the "im" feature 121b will be represented by output data signals 101c emerging from computer 101 and stored on computer-readable media 104. The corresponding LAYER-1 data output 121a for the LAYER-1 mask will be sent to a mask manufacturing house 130.

The mask manufacturing house 130 will use the supplied LAYER-1 mask-defining file 104 to manufacture a corresponding photolithographic mask. The manufactured mask (not directly shown, see instead 82a of FIG. 1C) will be inspected at step 132. Typically the customer who ordered the mask will supply a separate list 131 which contains a relatively small number of coordinates at which representative critically-dimensioned features of the mask (mask CRF's) are expected to occur. See items 82b of FIG. 1C.

Mask manufacturing (130) is not a perfect process. Therefore, the actual features 132d which appear on the manufactured mask may not be exactly the same as their counterpart idealized, on-mask features 121b (as specified by computer file 104). For example, there may be some amount of mask-manufacturing error, $e_{mm111}$ between an actually-realized, on-mask length ($L_{am111}$) of manufactured feature 132d and the idealized length ($L_{im111}$) specified by the file 104. Similarly the actual location coordinates ($x_{am1}, y_{am1}$) may be slightly different from the computer-specified ideal coordinates ($x_{im1}, y_{im1}$). If the deviations between actual and idealized mask features are below predefined thresholds, the mask inspection step 132 should result in acceptance 132a of the manufactured mask. If the deviations are too large, the mask may be discarded as indicated by path 132b or the mask may be returned for rework as indicated by selectable path 132c. The reworked mask may then be again inspected in step 132 and either accepted or discarded as appropriate.

Moving further along in FIG. 1D, it is assumed that a given mask has been accepted (132a). The mask is next supplied to an idealized LAYER-1 photolithographic process 140. In process 140, the on-wafer resist (86) is exposed, developed (91), and used for patterning the underlying material layer (87) by etching or otherwise. Inspection of the produced, in-process wafer occurs in step 142. The wafer-layout design groups who created Table 110 will provide an identification 141 of a small number of on-wafer critically-dimensioned features (wafer-CRF's) for use in the wafer inspection step 142.

Conventionally, this identification 141 of the on-wafer critically-dimensioned and representative features has been carried out by use of the CD bar region 55 (FIG. 1A). The CD bar region 55 has been the exclusive domain of the "on-wafer" layout design groups. The "on-mask" technology groups are not expected to enter into this domain. Also by convention, the identification (131) of the on-mask critically dimensioned and representative samples (mask CRF's) has pointed to in-die areas 82b of the mask 82a as is shown in FIG. 1C.

Referring still to inspection step 142, when the actual wafer layer is manufactured the actual on-wafer feature 142d may be located at a slightly different place ($x_{aw1}, y_{aw1}$) than that envisioned by the idealized coordinates given for computer-defined, counterpart feature 111b. The actual length ($L_{aw111}$) of the actual wafer feature 142d is a functional transform f (L) of the actual on-mask length ($L_{am111}$). The real world transform may be different from the idealized transform, f ($L_{am111}$) due to wafer-to-wafer and/or batch-to-batch manufacturing variances. If the statistical compilation of actual on-wafer errors ($e_{aw111}$) exceeds predefined thresholds than the inspected-wafer will either be discarded as indicated by selectable path 142b or it will be returned via path 142c for rework by way of lithographic processing 140 and then returned for subsequent inspection 142 again. If the wafer inspection step 142 indicates acceptance 142a, then the in-process wafer will be transferred to step 150 for the forming of its next layer. For example, a computer idealized feature 151b may be converted by transform function 160 into an idealized on-mask feature (not shown) and so on and so forth. The process is repeated layer after layer under the supervision of different layer specialty groups until the wafer fabrication is completed without rejection at any of the respective wafer layer inspection stations (like 142).

FIG. 1E provides a flowchart for a less idealized world 100'. In this less-idealized world 100', dimension scaling and process pre-compensating transforms are performed in function box 121'. The dimension scaling is 1-to-4 (1:4) meaning that the size of on-mask features is going to be four times larger than their counterpart on-wafer features. It is understood that the stepper optics (83 of FIG. 1C) will perform a reverse 4:1 operation. Dimension scaling in transform box 121' can be different for each material layer and it may also be nonlinear across the reticle field to precompensate for known distortions of the stepper optics (83).

A further distortion is understood to possibly occur due to photochemistry effects in the exposure (84) and/or development (91) steps and/or due to further shape distorting effects in the patterning (e.g., etching, 91) step. By way of example, it is assumed that for the given to-be-patterned, material layer (e.g., 87 of FIG. 1C), certain Optical Proximity Effects (OPE) cause the longitudinal ends of rectangular, on-mask features (e.g., 121b of FIG. 1D) to become rounded (see 142d' of FIG. 1E) and shortened when ultimately imaged, developed and/or patterned on the wafer. In order to pre-compensate for such OPE's, Optical Proximity Compensating (OPC) transformations are made. The example of FIG. 1E shows that the idealized, on-wafer rectangular shape (111b') is converted by OPC into a Hammer-Head shape. The increased length and width of the hammer-heads provided at the longitudinal ends of the OPC'ed object (121b')

ideally convert back to a simple rectangular shape (e.g., 142i as the ideal output of process 140') if all steps proceed as planned.

However, in our less-idealized world model 100', all steps do not proceed exactly as planned. The less-than-ideal, mask-making house 130' produces an actual on-mask feature 132d' that is different from the idealized output 121b' of transform means 121'. The amount of mask-making error ($e'_{mm111}$) in terms of feature length, width, linearity, angles, and/or other aspects of shape, size and/or of opacity or transparency may be within predefined tolerances or outside of such bounds. As in the case of the more-idealized model (FIG. 1D), the mask inspection process 132' accepts (132a') the actualized mask if the mask-CRF's are within the predefined tolerances. It rejects (132b') the actualized mask if the mask-CRF's are irreparably outside specifications. The mask inspection process 132' may allow for rework (132c') if the inspected, mask-CRF's indicate that repair/rework of the mask may cure the problem(s).

The less-idealized world model 100' of FIG. 1E also depicts some of the problems that can develop in less-than-ideal lithography and post-development patterning 140'. The actually-produced, on-wafer feature 142d' may be more rounded and/or foreshortened at its longitudinal ends than desired. Alternatively, the actually-produced, on-wafer feature 142d' (not shown this way) may retain too much of the pre-compensating hammer-heads shape instead of reducing further down towards the desired, ideal shape 142i. It may be possible; somewhat like a microscope's focus being adjusted up or down to bring a sighted object into sharper focus, that the process engineers of process 140' can "tune" 142d' the photolithography and/or patterning processes 140' so that the counterpart feature(s) 142d' in a subsequently-produced wafer are closer to the ideal 142i than before. Therefore there can be significant value for wafer processing engineers in being able to observe what happens, as a result of proximity or like effects, to an isolated, hammer-headed feature (e.g., 132d') of the produced mask (82a) and/or to another such OPC'ed feature (not shown, but understood to be something other than mere hammer-head). However, conventionally during wafer inspection 142', only the wafer-CRF's are identified by step 141'. There is no identification given to the process-tuning engineers (those who manage step 142d') of what on-wafer features correspond to on-mask critically representative features (mask-CRF's).

Assuming that step 142' provides an acceptance (142a') of the inspected on-wafer layer (e.g., 87 of FIG. 1C), the less-than-ideal model 100' continues with advancement step 150 which transfers the in-process wafer to the next layer group. The pre-compensating transform means 161' of the next layer group may have its own unique scaling factor(s) (e.g., 1:5 instead of 1:4) and/or it may have its own unique shape-shifting algorithms (e.g., HH-2 instead of HH-1). The next layer group (150') may use a different mask-making house than that (130') used by the group handling the preceding material layer (LAYER-1) and/or the next layer group (150') may use completely different photolithography and/or patterning processes (not shown but understood to follow step 161a') than that (140') used by the preceding group. There can be one factor, however, which provides cross-coupled interaction from one layer group to the next. It is the inter-layer cross-topography effect 155'. The topographic features in a lower layer (see 89b of FIG. 1C) can contribute to anomalies (e.g., 87b of FIG. 1C) produced in an overlying layer (87) during photolithography and/or patterning. This inter-layer cross-topography effect 155' complicates statistical analysis of on-wafer results (e.g., feature 142d' and its counterparts across the same wafer) because it is often not clear whether observed deviations are due to cross-topography effects (155') or due to other mechanisms within the realms of mask-layout (e.g., 75 of FIG. 1C), or mask-making (130'), or photolithography and/or patterning (140'). Accordingly, it becomes difficult to provide useful feedback information to the mask-layout groups, the mask-making groups, the photolithography groups and/or the material layer patterning groups which would help them to fine tune (e.g., 142d') their respective operations in light of what is observed in the wafer inspection step 142'. It would be beneficial if a statistically less-murky picture could be developed during the wafer inspection step 142'.

Before moving on to the solutions described via FIG. 2, we digress for a little further house-cleaning regarding how computer files are managed in the less-than-ideal model 100' of FIG. 1E. Readers may have gotten the impression that a mega-file such as the one (103a) described for FIG. 1D is actually created. That is rarely possible in the real world because the amount of detailed information needed to describe the entire wafer (assuming a complex one) is more than what currently practical computer systems can handle. Besides that, there is no practical use for such a mega-file because each material layer group operates as if in an isolated world of their own. So the more-practical approach is to create separate files 107' that each describe (103b') only one, idealized on-wafer layer at a time. This information (110') does not have any direct use for the mask-making house 130' because the latter house only wants to receive the output 121a' of the pre-compensating transform means 121'. The pre-compensating transform means 121' is typically implemented as computer software within computer system 101'. Thus, the actual media or data transmission 104' which the mask-making house receives is that corresponding to output signals 101c' from the IC design support computer 101'. As in FIG. 1D, item 102' can represent the software and/or supporting databases that are installed into the IC design support computer 101' to enable that computer to carry out its design-support tasks.

FIG. 2 shows a first photolithographic mask 282 that is structured in accordance with the present disclosure. The mask 282 includes a reticle image area 251 having plural die image areas 252 and one or more scribe-line image regions 254 interposed between two or more of the die image areas 252. Of importance, mask-quality sample points 282b are now provided in the scribe-line image regions 254 rather than only in in-die regions as was the case for sample points 82b of FIG. 1C. (The present disclosure allows for taking of quality-indicating sample data from both in-die and in-scribe image regions of the manufactured mask. However, it will be seen that sampling of only the quality-indicating samples 282b in the in-scribe image regions 254 can provide significant advantages.) The in-scribe, sample points 282b may be organized in various patterns across the reticle image area 251, including the illustrated 5-point star or other symmetrical formations that allow for collection of statistically significant, quality-indicating samples from different parts of the manufactured mask 282. (Among the alternative sample-point distributing patterns, one can have 7-point stars {3 on each of upper, lower edges and one in the middle}, 9-point stars and a pattern where there is an in-scribe, mask-quality sample point 282b near each of the four corners of each die image area 252, and/or where there is an in-scribe, mask-quality sample point 282b near each of the four edge midpoints of each die image area 252 within the manufactured mask 282.)

Illustrative magnification 282*a* shows that each of the in-scribe, mask-quality sample points 282*b* may include an augmented, CD-bar box 256. Such a CD-bar box 256 may contain an automatic-alignment mark image 258 and/or a layer-identifying, human-readable indicia image 259 (e.g., "AA" or "P1" or "C1" or "M1", etc. if in the English language.) Illustrative magnification 260*a* shows that each of the in-scribe, CD-bar boxes 256 should contain a combination 260 of quality indicating images for both wafer inspection purposes (e.g., 142' of FIG. 1E) and mask inspection purposes (e.g., 132' of FIG. 1E). More specifically, in enlarged view 260*b*, the upwardly extending rectangle 257 represents the on-mask imagery that will produce on-wafer critically representative features (wafer-CRF's) after the corresponding wafer is exposed (84), developed (91) and/or patterned. Horizontal separation dimension 257*a* is the on-mask counterpart to the actual on-wafer horizontal separation dimension that will be measured during wafer inspection (142').

The hammer-head shaped and cross-hatched features 261, 263, 265 represents the on-mask imagery (e.g., defined by opaque chrome or alternatively by transparent quartz) that will be inspected during mask inspection (e.g., 132' of FIG. 1E). Horizontal separation dimension 266 is one of the on-mask, critically representative features that can be measured and statistically analyzed in combination with alike separations of others of the in-scribe, sample points 282*b* during mask inspection (132'). Vertical separation dimension 264 (between the rows of hammer-heads 261 and 263) is another of the on-mask, critically representative features that can be measured and statistically analyzed in combination with alike separations of others of the in-scribe, sample points 282*b* during mask inspection. Vertical separation dimension 267 (between the row of wafer-CRF images 257 and hammer-heads 261) may serve as a representative feature for both mask inspection (132') and wafer inspection (142') and may be set in a distance range between the distances of separation dimensions 257 and 266.

Several advantages may be derived from the inclusion of the mask-CRF's (261–265) in the in-scribe image regions 254 and from such mask-CRF's being positioned adjacent to (or intermingled with, as shall be seen in FIG. 3) the on-mask imagery for the wafer-CRF's (257). First, the problem of locating mask-CRF's with the use of origin finding and relative coordinates (see again item 53 of FIG. 1A) is obviated. Practitioners do not have to worry about how to locate the exact center of the manufactured mask and how to get the latest coordinates for mask-CRF's. Instead they may use the automatic-alignment mark image 258 (which can have the illustrated mirror-image E-shape or another shape) and/or the layer-identifying, human-readable indicia image 259 (e.g., "AA") to quickly and/or automatically locate the on-mask image of the augmented, CD-bar box 256. Then within the augmented, CD-bar box 256, the appropriate collection of mask-CRF's may be found immediately adjacent to one another so that all can be looked at, and measured, in relatively short time without having to command an X-Y displacement stage to move between far apart CRF's that are identified with X, Y coordinates which may be faulty. The inspection of the in-scribe mask-CRF's may be carried out manually or with the use appropriate robotic means. In the case of use of robotic means (which can be represented by icon 282*a*), one or more of the relatively large sized aspects of the in-scribe lines (254), the automatic-alignment mark image 258 and the human-readable indicia image 259 (e.g., "AA") may be used to quickly an X-Y-theta displacement stage to bring area 260*b* into focus under a robotic scanning means (e.g., a scanning electron microscope, SEM) and to adjust the angle (theta) so that area 260*b* is properly aligned with measurement-taking means within the robotic means for taking measurements of all the critically representative features of the on-mask chrome and/or glass patterns (261–267) that may be relevant to the mask inspection process (132') and/or to a further downstream, wafer inspection process (142').

A further advantage is that not all of the mask-CRF's (261–267) have to be exact replicas of in-die counterparts. In the past, when the mask sample points (82*b* of FIG. 1C) were in-die objects, mask inspection engineers had no choice. The objects that were inspected for qualifying the manufactured mask were one and the same as whatever in-die objects (82*b* of FIG. 1C) happened to present themselves from the circuit design and in-die mask layout processes (71, 73, 75 of FIG. 1C). The mask inspection engineers had to pick out those of the in-die objects (82*b*) which they thought would provide a good indication of mask quality and they had to generate the separate coordinates list (131 of FIG. 1D) to give to the mask-making house (130, 130'). That limited their freedom to whatever patterns happened to present within the in-die sections (252) of the idealized mask file (121*b'*, 104').

By contrast, the placement of mask-CRF's in the in-scribe image regions 254 of the manufactured mask 282 provides mask inspection engineers with a much broader spectrum of options. They can still use the conventional method of identifying in-die objects as being critically representative features for purposes of mask inspection (132'). Alternatively or additionally, they can collect and copy such in-die and on-mask feature patterns into the in-scribe image regions 254, and more specifically they can place the aggregated and copied patterns (261–267) adjacent to (and/or in between) the on-mask, wafer-CRF's (257) so that the mask-CRF's (261–267) can be quickly found and quickly measured. Alternatively or additionally, they can define new on-mask patterns within the in-scribe region 260*b* as being mask-CRF's even though such, newly-defined on-mask patterns do not appear exactly as such in the in-die regions (252) of the mask.

More particularly, it is possible that the in-die counterpart (not shown) of inner hammer-head item 265 does not appear exactly as shown in the in-die image regions (252) of the mask so that it is fully surrounded at its top, bottom, left and right sides by other chrome features (e.g., 263) and/or by specific separations dimensions (e.g., 264, 266) such as provided within the mask-CRF's sub-area (260*b*) of the on-mask in-scribe region. Nevertheless, conditions may be such that the collective knowledgebase of the IC-fabricating organization indicates that the mask-making process should be stressed to provide better accuracy and/or precision than might be tested for within just the in-die image regions (252) of the mask. So the mask-making house (130') may be asked to produce the more OPC-stressed item 265 with its surrounding other features in accordance with tighter tolerances than might appear to be needed in the in-die image regions (252). And a plurality of in-scribe and on-mask test areas (282*b*) that are each structured such as shown at 260*b* might be used to verify that the mask-making house has met these specifications uniformly and within specified tolerances across the full spread of the on-mask reticle-area 251.

One reason why tighter compliance might be needed is because of cross-layer topographical effects (155' in FIG. 1E). The topographical effects may cause slight displacement of in-die features, which means there is less room for wider tolerance windows on the mask. The technology groups which generate the layout specifications (273) for the in-die circuits can transmit data 296 about possible topographical effects 295 to a behavior profiling database 280, where the latter is managed, for example, by the design and manufacturing assisting computer 201. The behavior profiling database 280 may additionally collect information about how various steppers (e.g., 83 of FIG. 1C) behave in view of the photoresist(s) (286) that planned to be used in conjunction with mask 282. The behavior profiling database 280 may include data (283) indicating how the optics of the planned stepper will behave depending on variable parameters. The behavior profiling database 280 may include data (291) indicating how the planned fabrication settings for the planned patterning tool (245) will affect outcome (the produced wafer 50"). In response to the fabrication planning data (295–296, 291, 286, 283) which the behavior profiling database 280 receives and analyzes, the design and manufacturing assisting computer 201 may carry out a proxies-defining step 250.

Figure 2A:
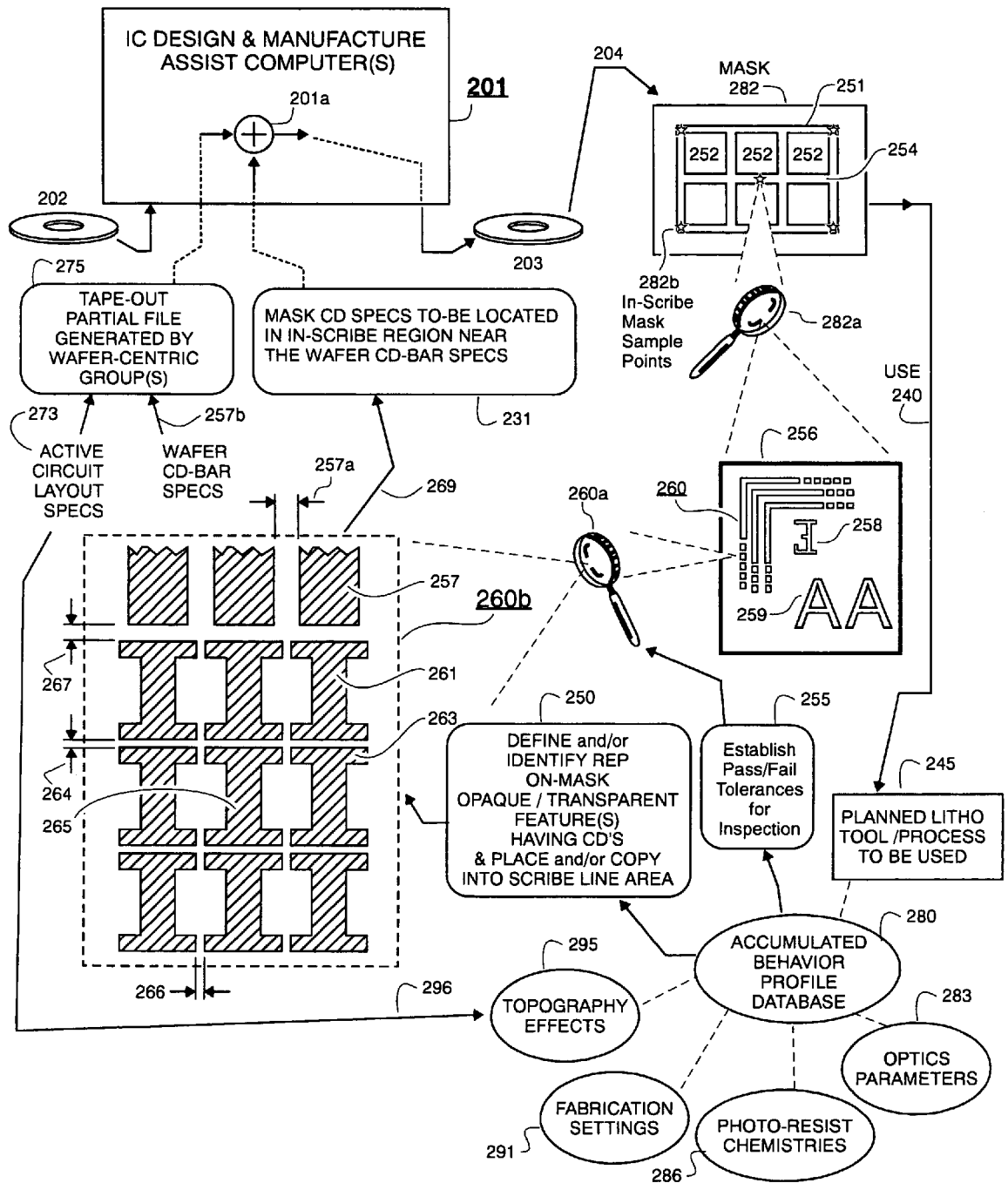
FIG. 2A is a flow chart showing how mask-CRF's (critically representative features used during mask inspection) may be placed in in-scribe regions of a manufactured mask in accordance with the present disclosure and how such mask-CRF's may be defined.

As indicated in FIG. 2A, this proxies-defining step 250 is responsive to the behavior predicting analysis conducted by database 280. The proxies-defining step 250 defines and/or identifies, representative on-mask features (which features can be opaque, transparent, or semi-transparent) that have shapes and/or sizes and/or surrounding other features which make accurate and precise fabrication (to within specified tolerances) of these identified/defined features on the mask, critical to successful mass-production of the end-goal wafer (50" in FIG. 1C). Thus they are deemed as mask-CRF's. The design and manufacturing assisting computer 201 causes the defined or copied mask-CRF's (e.g., 261–267) to be placed inside of the in-scribe region 260b as discussed elsewhere herein. The placement step may include the assignment (269) of absolute or relative positional coordinates to the computer data which defines the defined or copied mask-CRF's (e.g., 261–267). The so "placed" mask-CRF's then define a computer-usable data structure 231 which may be supplied to adding means 201a within computer 201. Another part of the adding means 201a receives the placed specifications for the active circuits 273 and the placed specifications 257b for the wafer-CRF's. The combination consisting of the placed active circuits 273 and the placed wafer-CRF's 257b, taken alone may define a convention mask tape-out 275. However that tape-out 275 is augmented with the addition (201a) of the placed mask-CRF's (231), where the latter mask-CRF's are further placed adjacent to and/or intermingled with the wafer-CRF's 257b. The augmented tape-out file 203 is then supplied 204 to a selected mask-making house for the making of a corresponding mask (e.g., 282). Then the in-scribe, mask-CRF's (261–267) are conveniently inspected (282a, 260a) by sampling copies of them at statistically relevant, in-scribe locations (282b) to assure that the mask-making house (e.g., 130' of FIG. 1E) has done the job properly. Pass/fail tolerances 255 for the inspection process (260a) may be defined and recorded by the same database 280 that defines and/or identifies, the critical representative on-mask features 250. The recorded pass/fail tolerance values 255 may be recorded in machine-readable format on the same media 203 that carried the augmented tape-out file.

It should be noted that FIG. 2A shows a closed loop feedback connection from the active circuit layouts 273, terminal item 295 of the profiling database 280, through CRF's defining step 250 and tolerances establishing step 255, through the tape-out augmenting step 201a and through the mask-making process (203, 204, 282) to finally get to the point where the manufactured mask 282 is inspected (260a)
using the defined mask-CRF's (260b) and the established tolerances (255), and if it passes, the manufactured mask (282) is used (where the use is represented by path 240) in the stepper and patterning tools (245) which were planned for when the partial mask tape-out 275 was produced.

Use of the in-scribe, mask-CRF's (261–267) does not have to end with the transfer 240 of the accepted mask to the fabrication groups 245. The tighter dimensional specifications (e.g., 264, 266) and tolerances (255) of the mask-CRF's may provide useful information to the photolithography and/or patterning engineers as the respective photosensitive layer (86) is developed and the respective material layer (87) is patterned (91). For example, the photolithography engineers may study the developed, on-wafer counterparts of the mask-CRF's to better understand the Optical Proximity Effects (OPE's) and to better tune the counteracting OPC's (Optical Proximity Compensations) when specifying a next mask. Study of the on-wafer counterparts of the mask-CRF's may alternatively or additionally help the photolithography and/or patterning engineers to fine tune their respective photolithography and/or patterning operations so that further wafers from the same mask come out more closely to what is ideally desired (103a of FIG. 1D). Of importance, it should be noted that the in-scribe and on-wafer counterparts to the mask-CRF's can be located in topographically flat and consistent regions of their respective material layers (see 87a, 89a of FIG. 1C). Therefore the statistical analysis of such consistently flat mask-CRF's can be free of topographical noise and can be more meaningful and useful as a result.

FIG. 2B flowcharts one or more successive operations 210 that may be carried out by machine-implemented and/or manual means in accordance with the disclosure. They are fairly self-explanatory at this stage. In step 211, the material layer that is to be photolithographically patterned is identified. In step 212, the corresponding stepper and lithography process are identified. In step 214, the corresponding patterning tool and patterning process are identified. In step 216, an identification is made of the topography and/or other optical effects of one or more of the pre-patterned layers below the identified, to-be-patterned material layer (211, 87).

In step 220, the currently developed, behavior-predicting database (e.g., 280 of FIG. 2A) is used to identify and/or define, manually and/or automatically, a subset of features which will, or can, appear on-mask (282) and/or on the PSL layer (86) and/or on the post-patterning material layer (87) where the identified or defined subset of features have shapes, dimensions, positions, relative spacings, relative angles, and/or other attributes (e.g., transparencies, opacities, thicknesses, reflectivities, absorptions, interference characteristics, resistance to isotropic or anisotropic etching, etc.) which will probably be relatively more critical from a deviation tolerance perspective than like attributes of other corresponding features of the respective mask, PSL layer (87) or post-patterning material layer (87) to the mass-reproducibility of the end-goal wafer (50" of FIG. 1C) and/or dice (98). As already explained, the "defined" ones of the critically representative features do not necessarily have identical attributes to those of the on-mask (282) and/or on-PSL layer (86) and/or on-patterned material layer (87) for which they function as statistical representatives. There can be situations where one or more of the "defined" on-mask mask-CRF's are more challenging for the mask-making house to produce within specified tolerances than are any of the in-die and on-mask features (e.g., chrome or glass). There can be situations where one or more of the "defined"

on-resist wafer-CRF's are more challenging for the lithography engineers to mass reproduce within specified tolerances from the mask (282) than are any of the in-die and on-resist features. There can be situations where one or more of the "defined" on-layer wafer-CRF's are more challenging for the patterning engineers to mass reproduce within specified tolerances from the developed resist (86) than are any of the in-die and on-layer features. These, harder-to-make, test features can serve as bell weathers (sensitive warning indicators) for subtle changes in production factors and can be used to provide early warning of problems developing within the less challenging, other mask-CRF's and/or wafer-CRF's.

In step 221, the virtually-on-mask images of the subset of critically representative features which have been defined and/or identified in step 220 are collected for virtual placement (computer-indicated placement) in the in-scribe image regions of the mask which will be later sampled for statistical conformation that mask-making has proceeded as desired and/or resist development and/or material layer patterning have proceeded on a mass-production basis as desired. In step 222, the more conventional tape-out file is augmented by adding to it the in-scribe placed, mask-CRF's and other such additional critically representative features. In step 230, the augmented tape-out file (203) is used (as represented by step 204 of FIG. 2A) to manufacture the actual (non-virtual) mask (e.g., 282 of FIG. 2A).

In step 232*a*, the in-scribe alignment mark (258) and/or other aspects (e.g., indicia 259) of the on-mask CD-bar regions are used to manually and/or automatically locate the on-mask, mask-CRF's features at respective, pre-identified sample points (282*b*) and to measure their vital dimensions or other attributes by use of a scanning electron microscope (SEM) and/or by use of other scanning and measurement equipment. In step 232*b*, the found and sampled critical dimensions and/or other attributes of the mask-CRF's are statistically analyzed to determine if the manufactured mask is within tolerances. The results are recorded in the profiling database for future use when determining which mask-making houses to next use for future mask-making projects.

If the manufactured mask is accepted in step 232*b*, then in subsequent step 233 the accepted mask is used in the identified lithography tool (identified in step 212) with the identified lithography process to create a counterpart, developed image in the resist layer. In step 234, the in-scribe alignment mark (258) and/or other aspects (e.g., indicia 259) of the on-resist CD-bar regions are used to manually and/or automatically locate the on-resist counterparts of the, mask-CRF's and/or resist-CRF's (if any) and/or wafer-CRF's at the respective, pre-identified sample points (282*b*) and to measure their vital dimensions or other attributes by use of a scanning electron microscope (SEM) and/or by use of other scanning and measurement equipment. In step 235, the found and sampled critical dimensions and/or other attributes of the on-resist CRF's are statistically analyzed to determine if the developed resist is within tolerances. The results are recorded in the profiling database for future use when determining what behavior to expect and which lithography equipment and/or lithography processes should be next used for future projects.

If the developed PSL is accepted in step 235, then in subsequent step 236 the accepted post-development resist layer (86) is used in the identified patterning tool (identified in step 214, e.g., an etching tool) with the identified patterning process to create a counterpart, patterning in the material layer (87). In step 237, the in-scribe alignment mark (258) and/or other aspects (e.g., indicia 259) of the on-layer CD-bar regions are used to manually and/or automatically locate the on-layer counterparts of the, mask-CRF's and/or resist-CRF's (if any) and/or wafer-CRF's at the respective, pre-identified sample points (282*b*) and to measure their vital dimensions or other attributes by use of a scanning electron microscope (SEM) and/or by use of other scanning and measurement equipment. In step 238, the found and sampled critical dimensions and/or other attributes of the on-layer CRF's are statistically analyzed to determine if the patterned material layer is within tolerances. The results are recorded in the profiling database for future use when determining what behavior to expect and which patterning equipment and/or patterning processes should be next used for future projects. Of importance, the statistical deviation results of step 238 can be made free of topographic effects noise because the CRF's (including on-layer counterparts of the mask-CRF's and/or resist-CRF's) can be placed in planar regions of the in-scribe parts of the wafer (e.g., 87*a*, 89*a* of FIG. 1C) where topographic effects are negligible.

Irrespective of whether the patterned material layer is accepted in step 238, part or all of the information collected in steps 232*b*, 235 and 238 may be used to responsively tune the respective material layer patterning operations (236) and/or the respective lithography operations (233) and/or the respective mask-making operations (230) and/or the respective mask-layout design algorithms (222) based on the experience-filled database developed by steps such as 232*b*, 235 and 238. The database consulting algorithm can even be further tuned in view of analysis of its predicting performance to date. Then, in step 241, part or all of the workflow 210 may be repeated again with one or more of the process tunings in place. For example, if only the material layer patterning operations (236) were responsively tuned, then the same photolithography mask (of step 230) and lithography operations (233) would be repeated and thereafter followed by the tuned material layer patterning operations (236). On the other hand, if the accumulated analysis information indicates that a different lithography tool needs to be used, then the responsively tuned workflow may be repeated by starting from step 212 (identify new lithography tool and/or new lithography method). Tuning may include the changing of plasma etching time and/or the changing plasma etching power and/or the changing plasma etching bias and/or the changing plasma etching gas flow rates and/or the changing plasma etching gas composition. Tuning may also include the changing of lithography exposure time and/or the changing of exposure optics settings and/or the changing of chemical composition of the photosensitive layer (86) and/or the changing of lithography temperature and/or the changing of chemistry of a utilized resist removing solvent. The illustrated workflow scheme 210 may be repeated again not only for a same material layer, but also for two or more of the material layers which make up a monolithically integrated end product. Thus the resultant wafer or other integrated end product can be the beneficiary of CFR-driven tunings for plural ones of its constituent layers.

Figure 3:
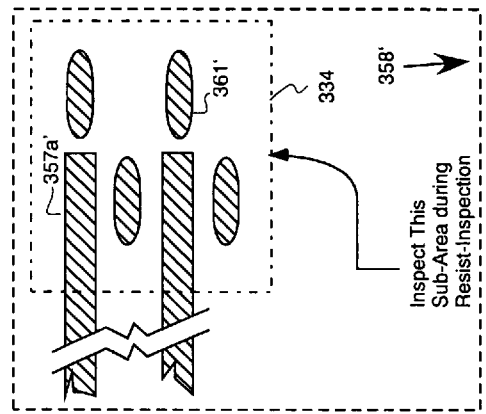
FIG. 3 is schematic top plan view showing the progression of in-scribe mask-CRF's as work flow moves from mask-making to resist development to patterning of the corresponding material layer.
Figure 3:
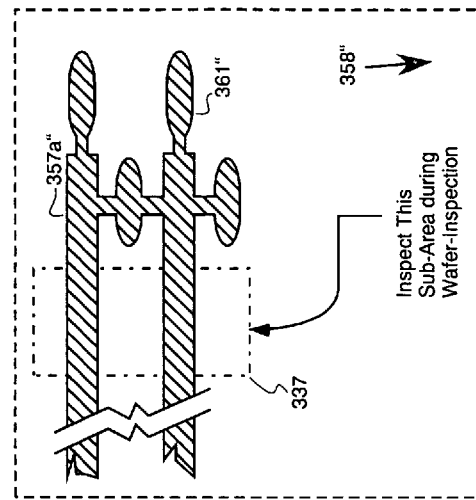
Figure 3:
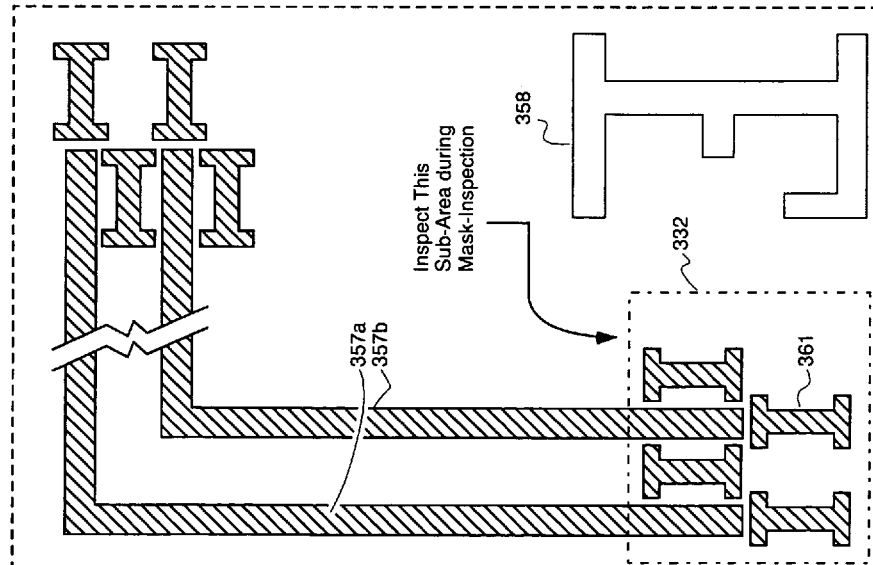

FIG. 3 is schematic top plan view showing a possible progression of in-scribe CRF's as work flow moves from mask-making to resist development to patterning of the corresponding material layer. View 301 shows part of the on-mask CD-bar box including the on-mask wafer-CRF's 357*a* and 357*b* which are dimensioned to reduce down (e.g., due to the planned 4:1 magnification step) to on-wafer line-widths and on-wafer feature spacings that are deemed critical for patterning of the corresponding material layer. The on-mask mask-CRF's (e.g., 361, 332) are dimensioned for 1:1 scaled inspection after the mask is made. Alignment mark 358 may be used for quickly finding the inspection area 332 and aligning to its X and Y axes. Note that the on-mask mask-CRF's of inspection area 332 can include those which are intermingled (e.g., interdigitated) with the on-mask, wafer-CRF's (357*a*, 357*b*). This intermingling arrangement can provide a relatively good proxy for the optical proximity effects to be expected on the subsequently imaged and developed photosensitive layer.

In the exemplary, on-resist view 302, the mask of view 301 has been used with 4:1 reducing optics to produce the illustrated on-resist image. The hammer-head shaped CRF 361 of view 301 has undergone optical proximity effects due to imaging and development and may now appear as a shortened and edge-rounded counterpart 361' in the developed resist. The on-resist counterpart 358' of the on-mask alignment mark 358 is not shown but is understood to be nearby as it was in view 301. On-resist area 334 may be used for determining if critically representative features developed as desired to remain within pre-specified tolerance ranges for dimensions, shapes, and so forth.

In the exemplary, on-layer view 303, the developed PSL of view 302 has been used to produce the illustrated on-material layer image. The hammer-head shaped CRF 361 of view 301 has now undergone both optical proximity effects and patterning effects and may therefore now appear as a shortened, edge-rounded and bridged counterpart 361" in the patterned material layer. The on-wafer counterpart 358" of the on-mask alignment mark 358 is not shown but is understood to be nearby as it was in view 301. On-wafer area 337 may be used for determining if critically representative features were patterned as desired to remain within pre-specified tolerance ranges for dimensions, shapes, and so forth. If they were, then the in-process wafer is forwarded to the next layer group for further imaging and patterning as may be appropriate. The resultant, final wafer 50" (FIG. 1C) can include plural ones of in-scribe, CRF patternings were the latter CRF patternings are used for verification of proper mask-making and/or verification of proper lithography and/or verification of proper layer patterning.

The present disclosure is to be taken as illustrative rather than as limiting the scope, nature, or spirit of the subject matter claimed below. Numerous modifications and variations will become apparent to those skilled in the art after studying the disclosure, including use of equivalent functional and/or structural substitutes for elements described herein, use of equivalent functional couplings for couplings described herein, and/or use of equivalent functional steps for steps described herein. Such insubstantial variations are to be considered within the scope of what is contemplated here. Moreover, if plural examples are given for specific means, or steps, and extrapolation between and/or beyond such given examples is obvious in view of the present disclosure, then the disclosure is to be deemed as effectively disclosing and thus covering at least such extrapolations.

Reservation of Extra-Patent Rights, Resolution of Conflicts, and Interpretation of Terms After this disclosure is lawfully published, the owner of the present patent application has no objection to the reproduction by others of textual and graphic materials contained herein provided such reproduction is for the limited purpose of understanding the present disclosure of invention and of thereby promoting the useful arts and sciences. The owner does not however disclaim any other rights that may be lawfully associated with the disclosed materials, including but not limited to, copyrights in any computer program listings or art works or other works provided herein, and to trademark or trade dress rights that may be associated with coined terms or art works provided herein and to other otherwise-protectable subject matter included herein or otherwise derivable herefrom.

If any disclosures are incorporated herein by reference and such incorporated disclosures conflict in part or whole with the present disclosure, then to the extent of conflict, and/or broader disclosure, and/or broader definition of terms, the present disclosure controls. If such incorporated disclosures conflict in part or whole with one another, then to the extent of conflict, the later-dated disclosure controls.

Unless expressly stated otherwise herein, ordinary terms have their corresponding ordinary meanings within the respective contexts of their presentations, and ordinary terms of art have their corresponding regular meanings within the relevant technical arts and within the respective contexts of their presentations herein.

Given the above disclosure of general concepts and specific embodiments, the scope of protection sought is to be defined by the claims appended hereto. The issued claims are not to be taken as limiting Applicant's right to claim disclosed, but not yet literally claimed subject matter by way of one or more further applications including those filed pursuant to 35 U.S.C. §120 and/or 35 U.S.C. §251.

What is claimed is:

1. A mask inspecting method comprising:
   (a) automatically finding on a given photolithography mask, locations of mask-CRF's (critically representative features of the given photolithography mask) by machine scanning for one or more, on-mask counterparts of CD-bar alignment marks; and
   (b) comparing the automatically located mask-CRF's to supplied mask-CRF specifications and determining differences between the supplied mask-CRF specifications and the correspondingly observed, mask-CRF's.

2. The mask inspecting method of claim 1 wherein:
   (a.1) said finding includes finding three or more different, in-scribe locations where similar mask-CRF's should be found;
   (b.1) said determining includes determining for each of the three or more different, in-scribe locations the differences between the supplied mask-CRF specifications and the correspondingly observed, mask-CRF's in the three or more different in-scribe locations; and the method further comprises:
   (c) performing statistical analysis on the differences determined for the three or more different, in-scribe locations.

3. The mask inspecting method of claim 2 and further comprising:
   (d) based on the performed statistical analysis, indicating whether the mask is in compliance or not with pre-defined tolerance parameters; and
   (e) if the mask is indicated to be in compliance, using the inspected mask for carrying out a corresponding photolithography process.

4. The mask inspecting method of claim 1 wherein:
   (a.1) said automatically located mask-CRF's include replicas of in-die counterparts that constitute critically representative features.

5. The mask inspecting method of claim 4 wherein:
   (a.2) said automatically located mask-CRF's include an aggregation of replicas of in-die counterparts that constitute critically representative features where the counterparts are not all aggregated within a corresponding die area.

6. The mask inspecting method of claim 1 wherein:

(a.1) said automatically located mask-CRF's include user-defined on-mask patterns do not appear exactly as defined by the user in in-die regions of the mask but where the user-defined on-mask patterns nonetheless function as critically representative features.

7. A lithography tuning method comprising:

(a) providing a photolithography mask having both mask-CRF's (critically representative features for use in mask inspection) and on-mask counterparts for wafer-CRF's (critically representative features for use in wafer inspection) disposed in in-scribe portions of the mask;

(b) using the provided mask in exposure of a first radiation-sensitive resist layer of a corresponding, first in-process wafer for thereby defining a developed lithography pattern in the first radiation-sensitive resist layer;

(c) after development, inspecting lithographically patterned parts of the resist corresponding to the in-scribe mask-CRF's to determine how closely the inspected resist parts conform to predefined, ideal lithography developments desired from use of the corresponding mask-CRF's; and (d) adjusting one or both of the exposure and development process used in step (b) and then repeating steps (b) and (c) instead for a second radiation-sensitive resist layer of a corresponding, second in-process wafer.

8. The lithography tuning method of claim 7 and further comprising:

(e) determining whether the adjustments of step (d) caused the inspected resist parts of the second developed resist layer to more closely conform to said predefined, ideal lithography results.

9. The lithography tuning method of claim 8 and further comprising:

(f) physically patterning the first and second in-process wafers;

(g) inspecting physically patterned parts of the first and second wafers corresponding to the in-scribe and on-mask mask-CRF's to determine how closely the inspected patterned parts conform to predefined, ideal patterning results desired from use of the corresponding mask-CRF's; and (h) adjusting one or more of the exposure, resist development and physical patterning processes used in steps (b) and (f).

10. The lithography tuning method of claim 9 and further comprising:

(i) repeating steps (b) through (g) instead for corresponding third and fourth, in-process wafers which have respective third and fourth radiation-sensitive resist layers; and (j) determining whether the adjustments of step (h) caused the inspected resist parts and/or inspected patterning results of the third and fourth, in-process wafers to more closely conform to said predefined, ideal lithography developments and/or ideal patterning results than did those of the first and second in-process wafers.

11. The lithography tuning method of claim 9 wherein said adjusting of one or more of the exposure, resist development and physical patterning processes includes one or more of:

(h.1) changing exposure time and/or changing exposure optics settings and/or changing chemical composition of the photosensitive layer;

(h.2) changing lithography temperature (before, during, and/or after exposure) and/or changing chemistry of resist removing solvent;

(h.3) changing patterning time and/or changing patterning temperature and/or changing chemistry of patterning process; and (h.3a) changing plasma etching time and/or changing plasma etching power and/or changing plasma etching bias and/or changing plasma etching gas flow rates and/or changing plasma etching gas composition.

12. A method of automatically locating on-mask CRF's (Critically Representative Features of a given photolithography mask), the automated method comprising:

(a) machine scanning for one or more, on-mask counterparts of CD-bar alignment marks; and (b) finding the sought on-mask CRF's essentially adjacent to the found on-mask counterparts of CD-bar alignment marks, said counterparts corresponding to on-wafer CD-bar alignment marks provided in scribe line regions of wafers, if any, produced from said given photolithography mask.

* * * * *